(12) United States Patent
Coteus et al.

(10) Patent No.: US 6,518,794 B2
(45) Date of Patent: Feb. 11, 2003

(54) AC DRIVE CROSS POINT ADJUST METHOD AND APPARATUS

(75) Inventors: Paul William Coteus, Yorktown, NY (US); Alan Gene Gara, Mount Kisko, NY (US)

(73) Assignee: International Business Machines Corporation, Armonk, NY (US)

( * ) Notice: Subject to any disclaimer, the term of this patent is extended or adjusted under 35 U.S.C. 154(b) by 12 days.

(21) Appl. No.: 09/818,796

(22) Filed: Mar. 27, 2001

(65) Prior Publication Data

US 2001/0038106 A1 Nov. 8, 2001

Related U.S. Application Data

(60) Provisional application No. 60/199,295, filed on Apr. 24, 2000.

(51) Int. Cl.[7] .............................................. H03K 19/00
(52) U.S. Cl. ........................................... 326/93; 326/83
(58) Field of Search ............................ 326/82, 93, 83, 326/95, 96

(56) References Cited

U.S. PATENT DOCUMENTS 5,309,035 A * 5/1994 Watson et al. .............. 327/141
5,602,512 A * 2/1997 Neron ......................... 327/12
6,100,733 A * 8/2000 Dortu et al. ................ 327/149

OTHER PUBLICATIONS

IBM 8Mb(256K×36&512×18)And 4Mb (128K×36&256K× 18) SRAM Brochure, trrn 3316.04, 7/99, 25 pages.

SLDRAM Inc. Brochure, 400Mb/S/pin 4M×18SLDRAM, Rev Jul. 9, 1998, 69 pages.

IBM 256 Mb Double Data Rate Synchronous DRAM Brochure, 29L0011.E36997, Apr. 3, 2000, 81 pages.

* cited by examiner

Primary Examiner—Don Le
(74) Attorney, Agent, or Firm—Daniel P. Morris; Alvin J. Riddles

(57) ABSTRACT

The invention teaches a technique for A C equilibration of the signaling levels and time of 1—>h and h—>1 transitions of CMOS drivers as received at CMOS receivers, so as to improve the rate at which data can be communicated between two CMOS devices.

It permits minimization of a switching delay in Double Data Rate Dram memories.

6 Claims, 11 Drawing Sheets

FIG. 3

| OPERATION | CKE n-1 | CKE n | $\overline{CS}$ | $\overline{RAS}$ | $\overline{CAS}$ | $\overline{WE}$ | DM | $BA_0$ $BA_1$ | $A_{10}$ | $A_0$ $A_9$ $A_{11}$ | MNE | NOTES |
|---|---|---|---|---|---|---|---|---|---|---|---|---|
| DEVICE DESELECT | H | X | H | X | X | X | X | X | X | X | INHBT | |
| NO OPERATION | H | X | L | H | H | H | X | X | X | X | NOP | |
| LOAD MODE REGISTER MODE OR EXTENDED MODE REGISTER | H | X | L | L | L | L | X | \multicolumn{3}{c\|}{OP CODE} | MRS/EMRS | 1 |
| ROW ACTIVATE | H | X | L | L | H | H | X | BS | \multicolumn{2}{c\|}{ROW ADDRESS} | ACT | 2 |
| READ | H | X | L | H | L | H | X | BS | L | COL | RD | 3 |
| READ W/ AUTO PRECHARGE | H | X | L | H | L | H | X | BS | H | COL | RAP | 3 |
| WRITE | H | X | L | H | L | L | V | BS | L | COL | WR | 3,4 |
| WRITE W/ AUTO PRECHARGE | H | X | L | H | L | L | V | BS | H | COL | WAP | 3,4 |
| BURST STOP | H | X | L | H | H | L | X | X | X | X | BST | 5 |
| PRECHARGE SINGLE BANK | H | X | L | L | H | L | X | BS | L | X | PRE | |
| PRECHARGE ALLBANKS | H | X | L | L | H | L | X | X | H | X | PREALL | |
| AUTO REFRESH | H | H | L | L | L | H | X | X | X | X | REF | 1 |
| SELF REFRESH ENTRY | H | L | L | L | L | H | X | X | X | X | SR(ENTRY) | 1 |
| SELF REFRESH EXIT | L | H | H | X | X | X | X | X | X | X | SR(EXIT) | |
| | L | H | L | H | H | H | X | X | X | X | | |
| POWER DOWN MODE (ENTRY) | H | L | H | X | X | X | X | X | X | X | PDN(ENTRY) | |
| | H | L | L | H | H | X | X | X | X | X | | |
| POWER DOWN MODE (EXIT) | L | H | X | X | X | X | X | X | X | X | PDN(EXIT) | |

1 SHOULD BE ISSUED ONLY AFTER BOTH BANKS ARE DEACTIVATED (PREALL COMMAND)
2 SHOULD BE ISSUED ONLY AFTER THE CORRESPONDING BANK HAS BEEN DEACTIVATED
3 SHOULD BE ISSUED AFTER THE CORRESPONDING BANK HAS BEEN ACTIVATED
4 ANY VALUED WRITE CYCLE APPLIED TO THE SLECTED BANK/ROW WIL BE MASKED ACCORDING TO THE DM
5 SHOULD BE ISSUED ONLY DURING READ BURST CYCLES

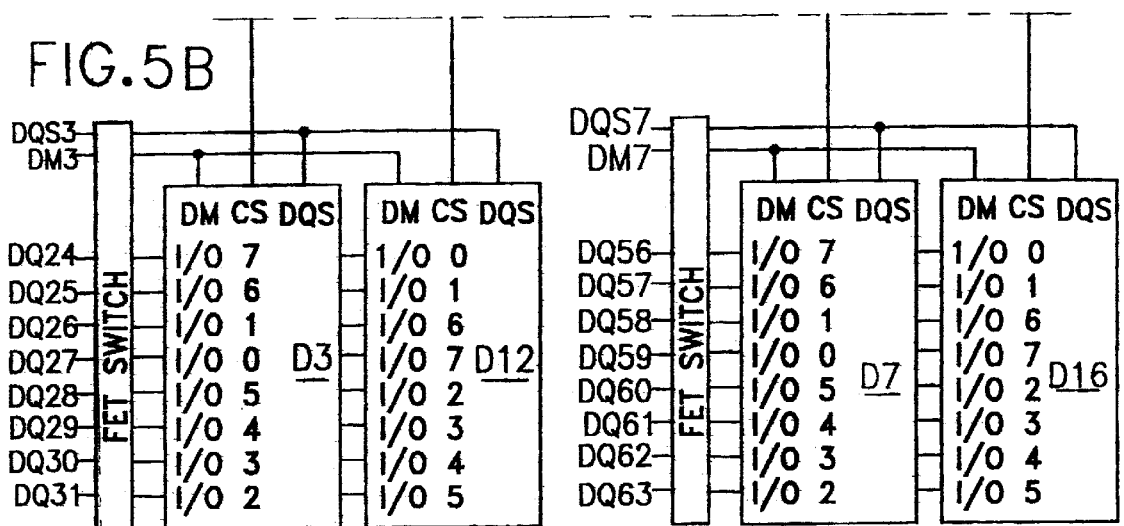
FIG.5B
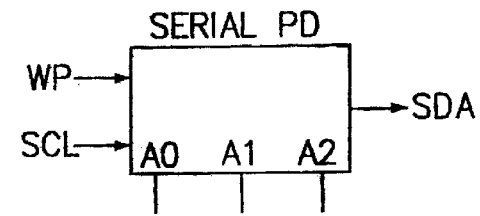
FIG.5C
FIG.5E
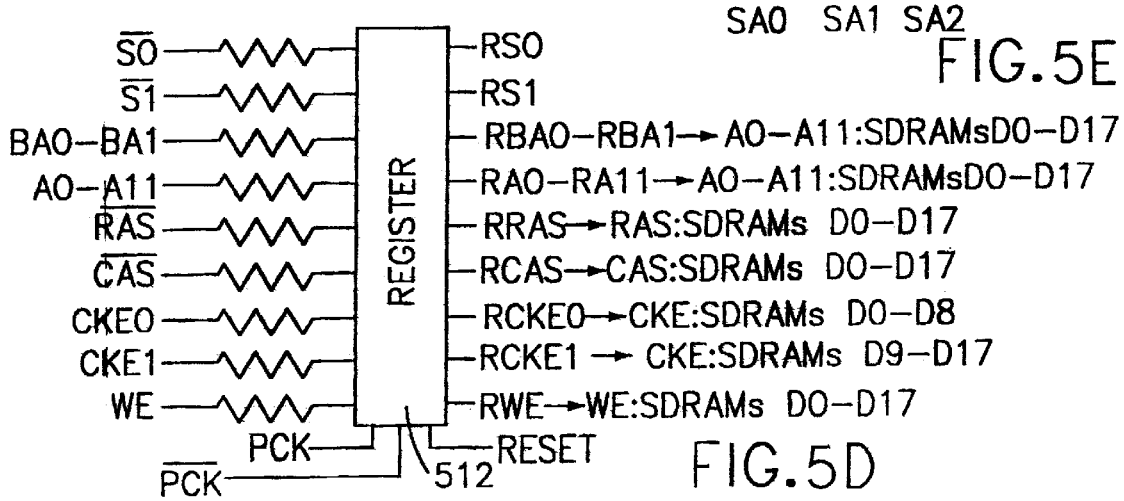
FIG.5D

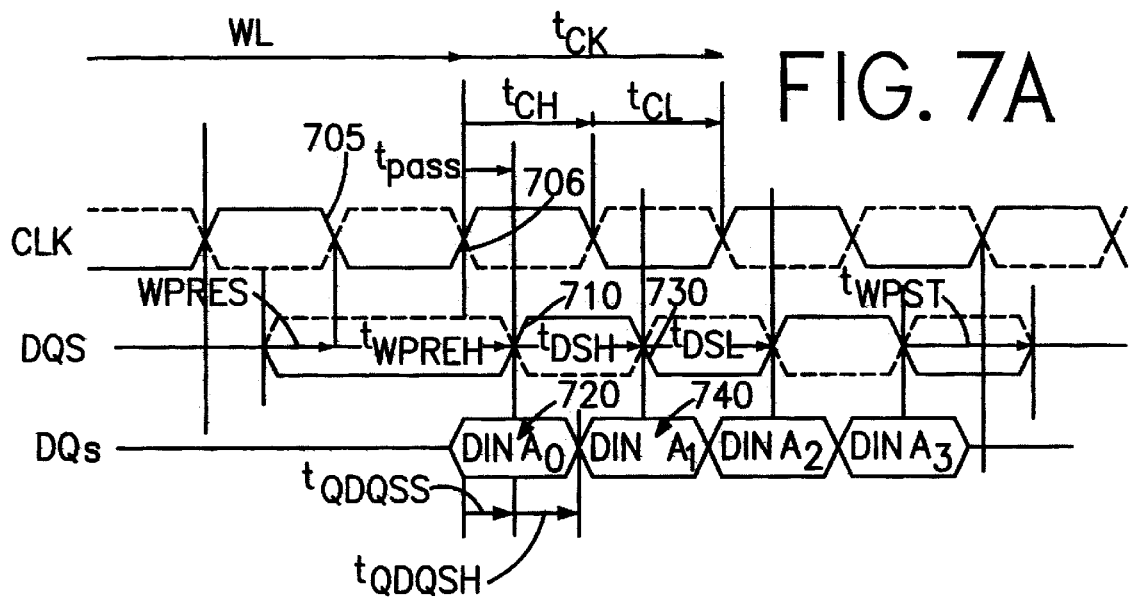
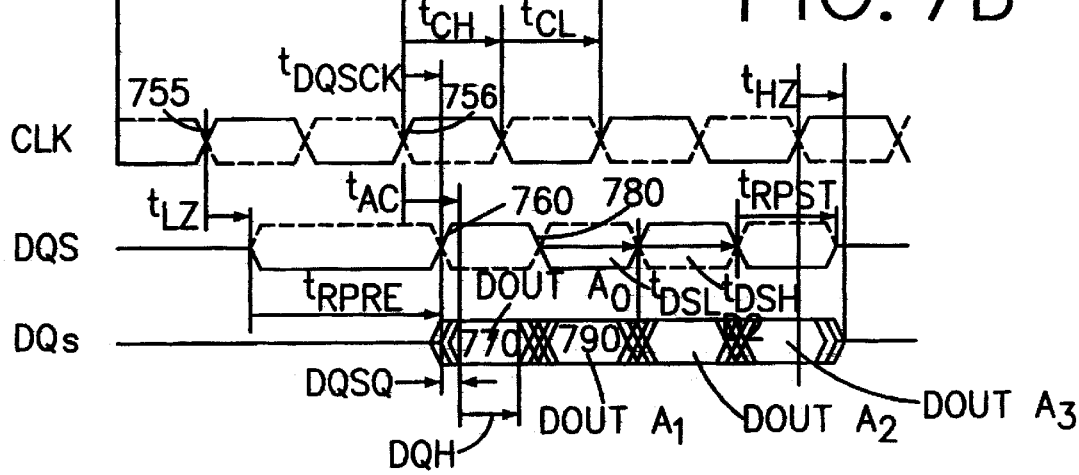
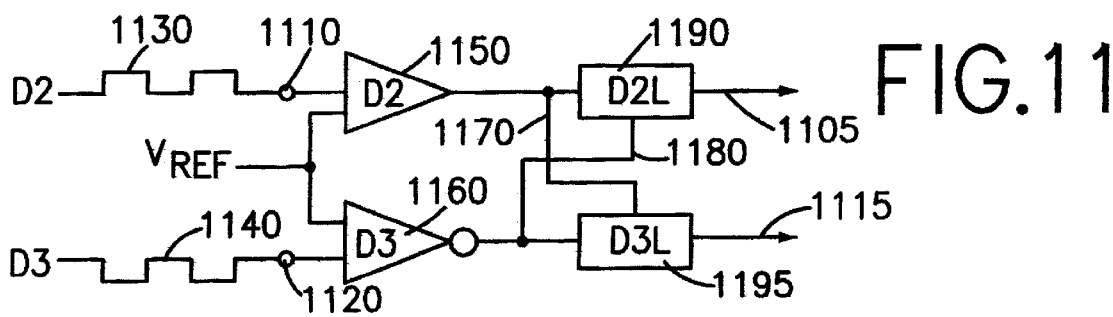

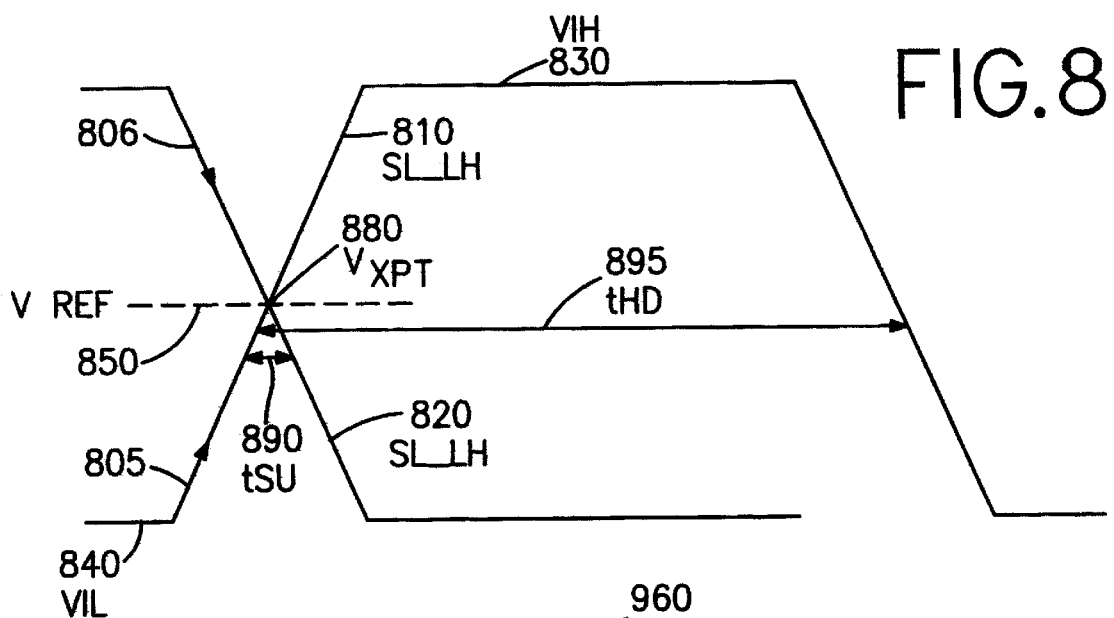
FIG. 8
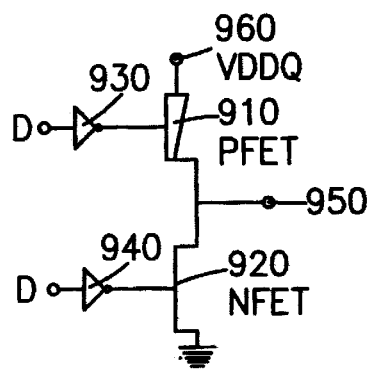
FIG. 9
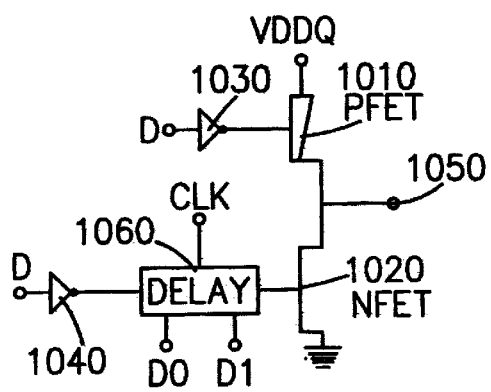
FIG. 10A
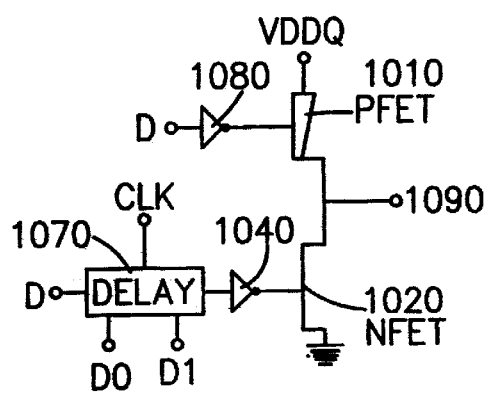
FIG. 10B
|    | 0 | 1 |
|----|---|---|
| D0 | NO CHANGE | CHANGE |
| D1 | REDUCE DELAY | INCREASE DELAY |
FIG. 10C

| WAVE FORMS | SIGNAL AT D3L OUT | SIGNAL AT D2L OUT | DELAY |
|---|---|---|---|
| TABLE A — D2, D3 waveforms with tsu | 1 | 0 | −2 |
|  | 0 ←SWITCH | 0 | −1 |
|  | 0 | 0 ←AVERAGE | 0 |
|  | 0 | 1 ←SWITCH | +1 |
|  | 0 | 1 | +2 |
| TABLE B — D2, D3 waveforms with tsu | 1 | 0 | −2 |
|  | 1 | 0 | −1 |
|  | 0 ←SWITCH | 0 | 0 |
|  | 0 | 0 ←AVERAGE | +1 |
|  | 0 AVERAGE | 1 ←SWITCH | +2 |
|  | 0 MOVE | 1 | +3 |
| TABLE C — D3 waveforms | 1 | 0 | −3 |
|  | 0 | 0 | −2 |
|  | 0 | 0 ←AVERAGE | −1 |
|  | 0 | 1 ←SHIFT | 0 |
|  | 0 AVERAGE | 1 | 1 |

FIG. 12

AC DRIVE CROSS POINT ADJUST METHOD AND APPARATUS

Conversion of Provisional Application Ser. No. 60/199,295 filed Apr. 24, 2000.

FIELD OF THE INVENTION

The invention relates to the method and apparatus used for communication between two or more semiconductor devices. In particular it relates to the calibration of output circuits for CMOS devices, to improve the uniformity of timing of signaling which is adversely effected by changes in temperature, voltage, processing conditions, properties of the conducting media between driving and receiving circuits, and properties of the receiving circuits.

BACKGROUND

As progress in the art evolves uniformity of CMOS driven circuitry performance is taking on increased importance.

In one reference, an IBM brochure labelled 8 Mb(256K× 36 & 512×18) and 4 Mb 128K×36&256K×18)SRAM, trrn 3316.04, 7/99,25 pages; there is described a method for the DC adjustment of output impedance. The adjustment allows the impedance on the pullup and pulldown devices in a standard CMOS output driver circuit to be made equal to each other, and to a fixed external reference In another reference, a SLDRAM Inc. brochure, labelled 400 Mb/s/pin 4 M×18 SLDRAM, Rev Jul. 9, 1998, 69 pages: another method of calibration allows output devices to present equal switching levels to a receiver for both high to low (H—>L) and low to high (L—>H) transitions. However, in these methods the time with which these switching levels are reached is not specified or calibrated.

Recently in the art, new signaling between CMOS devices has been introduced where a sending chip sends both data and a strobe waveform with data to be received by one or more receiving chips, whereby the strobe can capture data either on both 1—> and h—>1 transitions. Such a memory device is described in a an IBM brochure labelled 256 Mb Double Data Rate Synchronous DRAM, 29L0011.E36997, Apr. 3, 2000, 81 pages. With the Double data rate type comments described, any difference in time of arrival of l—>h and h—>1 transitions at the receiver can seriously limit the signaling rate. The transmission rate of the device in the Double Data Rate reference is limited to a 266 MHz rate, where each data bit is sent as a 1 or 0 on a single wire, in coincident with a strobe signal, alternating 1 and 0, on another wire. The value of the datum sent on the wire, 1 or 0, is determined by comparing the sampled voltage to a reference voltage at the receiver.

In the art there is a desire to transmit data at faster rates, however, lack of adequate controls on the time of arrival of data with respect to the strobe, and with respect to the reference voltage, can limit progress. What is needed is a simple means to adjust and control the time of arrival of data or strobe for both the 1 and 0 state, so that transmission speeds can be increased.

SUMMARY

The invention teaches a technique for A C equilibration of the signaling levels and time of 1—>h and h—>1 transitions of CMOS drivers as received at CMOS receivers, so as to improve the rate at which data can be communicated between two CMOS devices.

BRIEF DESCRIPTION OF THE DRAWINGS

FIGS. 1–7 are depicting diagrams illustrating in combination the application of the principles of the invention for equilibration of signal levels to a typical addressable SDRAM-DDR type CMOS driver memory assembly; wherein:

in FIG. 1, there is shown the available pin connections with address port, data port, and clock terminals for the assembly indicated;

in FIG. 2, there is shown in FIGS. 2A and 2B a drawing of an SDRAM-DDR type memory assembly;

in FIG. 3, there is shown a typical command table for use with a SDRAM-DDR type memory assembly;

in FIG. 4, there is shown a depiction of the card interconnecting arrangement on an SDRAM-DDR type memory card;

in FIG. 5, made up of FIGS. 5A–5E there is shown a schematic diagram of a SDRAM-DDR memory card;

in FIG. 6, there is shown computer system equipped with SDRAM-DDR type memory cards; and, in FIG. 7 there is shown the timing AC parameters for the read and write operations in accordance with the invention in a SDRAM-DDR type memory assembly.

In FIG. 8 there is shown an idealized waveform with unbalanced low to high and high to low transitions at the receiver.

In FIG. 9 there is shown an example of a driving circuit which can cause unbalanced transitions.

In FIG. 10, in FIGS. 10A and 10B there is illustrated driving circuit examples and example means for correcting any unbalanced transitions, and, FIG. 10C there is illustrated the effect of the balancing corrections in a truth table.

In FIG. 11 there is shown an example receiver with means to control the unbalanced transitions.

In FIG. 12 there is shown in tabular form the timing relationship between inputs and outputs of the receiver of FIG. 11.

DETAILED DESCRIPTION OF THE INVENTION

Figure 1:
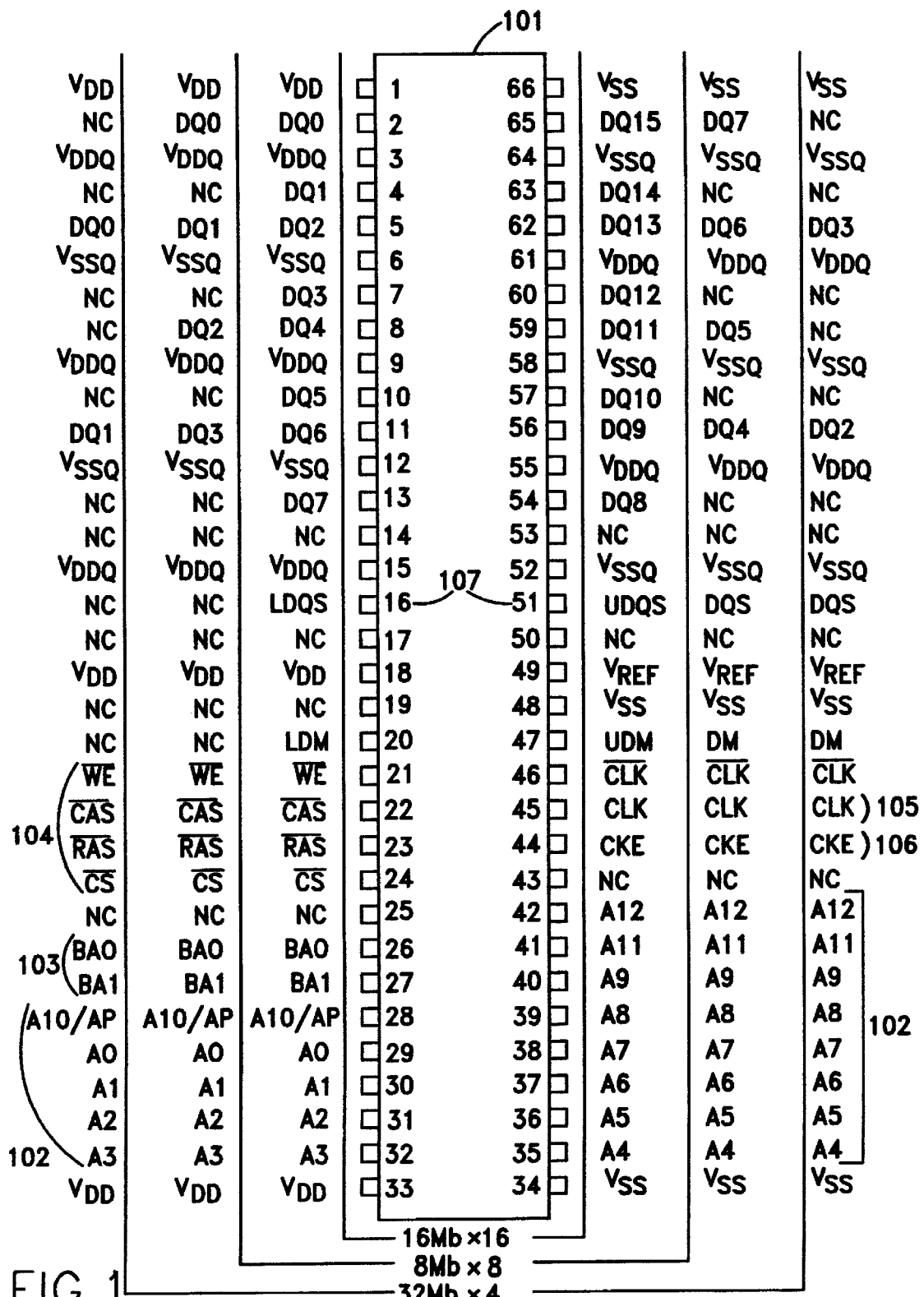

The invention is described as being applied to an existing SDRAM-DDR type memory device of the types shown in FIGS. 1–6 in which in FIG. 1, there is shown the pin array of the device labelled 101 with all signal pins listed. There are: address pins A0–A12, labelled (102) for addressing the memory contents by row and column, there bank select pins BA0–BA1 labelled (103) for addressing one of the 4 internal memory banks, there are command pins RAS, CAS, WE, and CS labelled(104) which respectively refer to row address, column address, write enable, and chip select. There is a differential clock CLK CLK/pair labelled (105) for synchronizing operations within the chip to a system clock, and a clock enable pin CLE labelled (106) for enabling/disabling the RAM clock. There are 4, 8, or 16 data ports labelled DQ0–DQ15 depending on the data width of the chip, with data strobes UDQS, LDQS labelled (107), one for each 8 data bits.

The data ports are used to send ( hereinafter called READ) and receive (hereinafter called WRITE) data, the strobe is driven with the data on a read and received with the data on a write, as a type of clock, with data present on both rising and falling edges of the strobe. There are also voltage supply pins VDD and VSS for the internal circuitry, and I/O voltage supply pins VDDQ and VSSQ for the data and strobe pins, and a reference voltage Vref pin for receiving data. The application of the invention is herinafter described in connection with FIGS. 1 and 2.

Figure 2A:
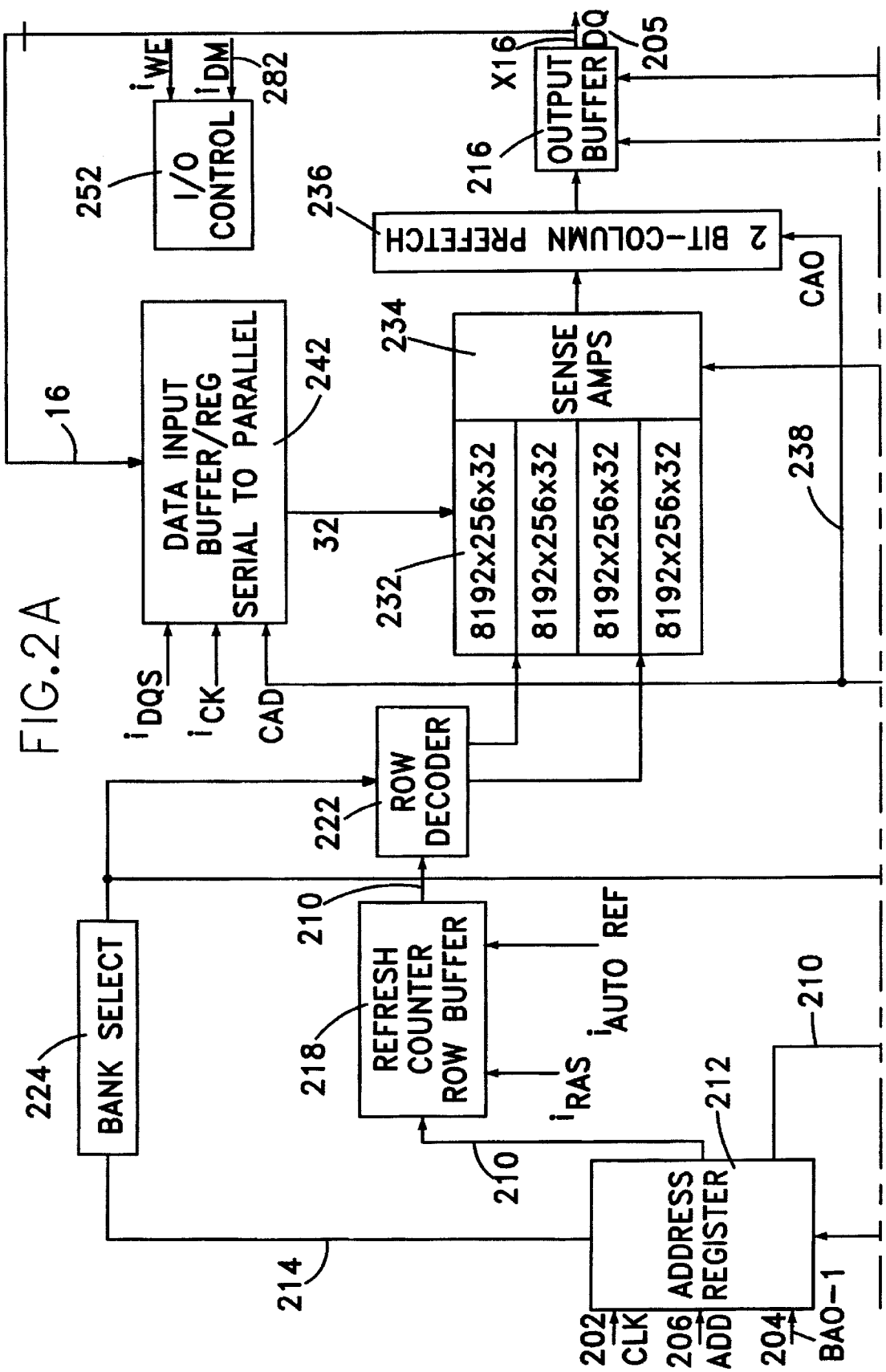
Figure 2B:
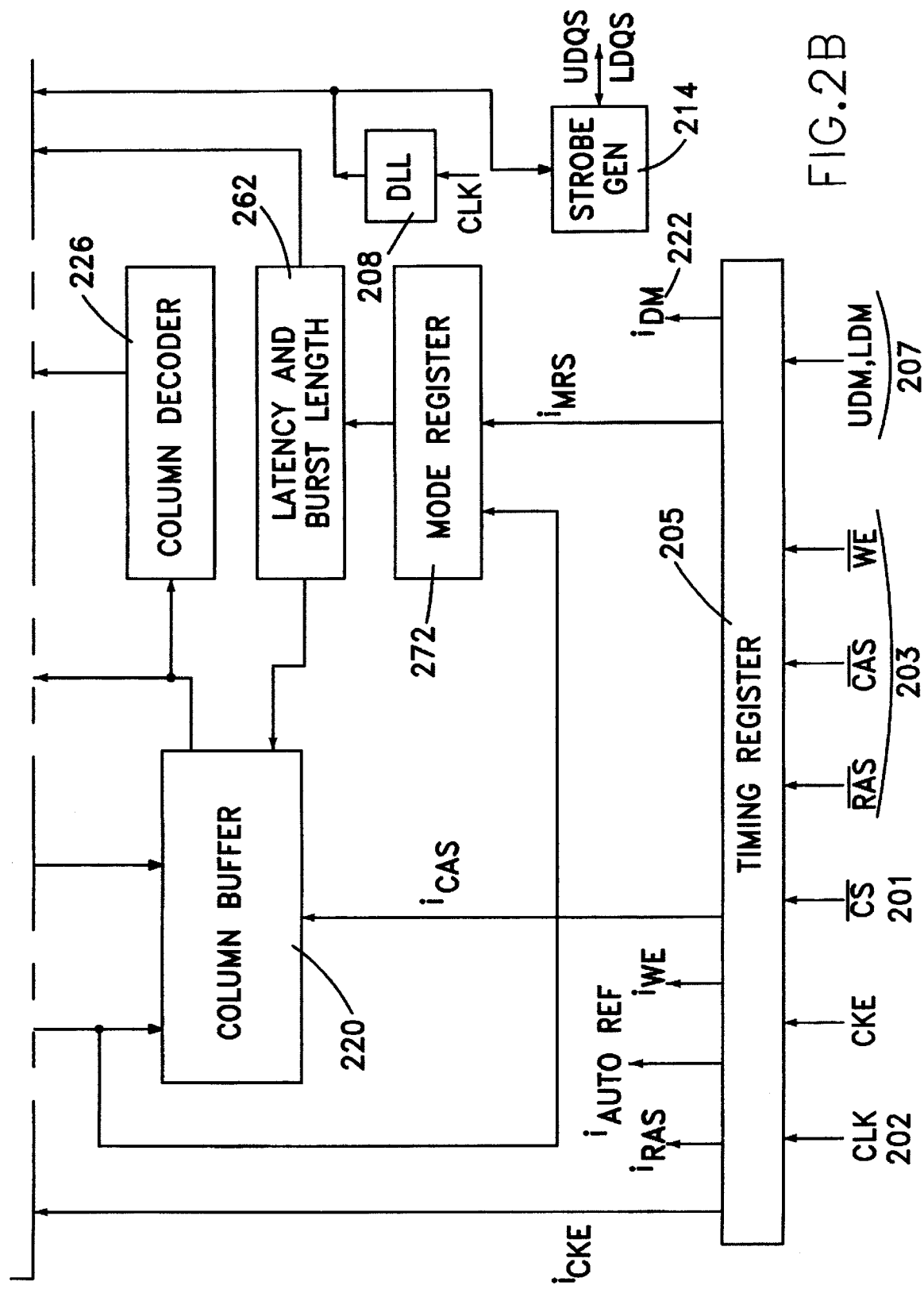
Figure 4A:
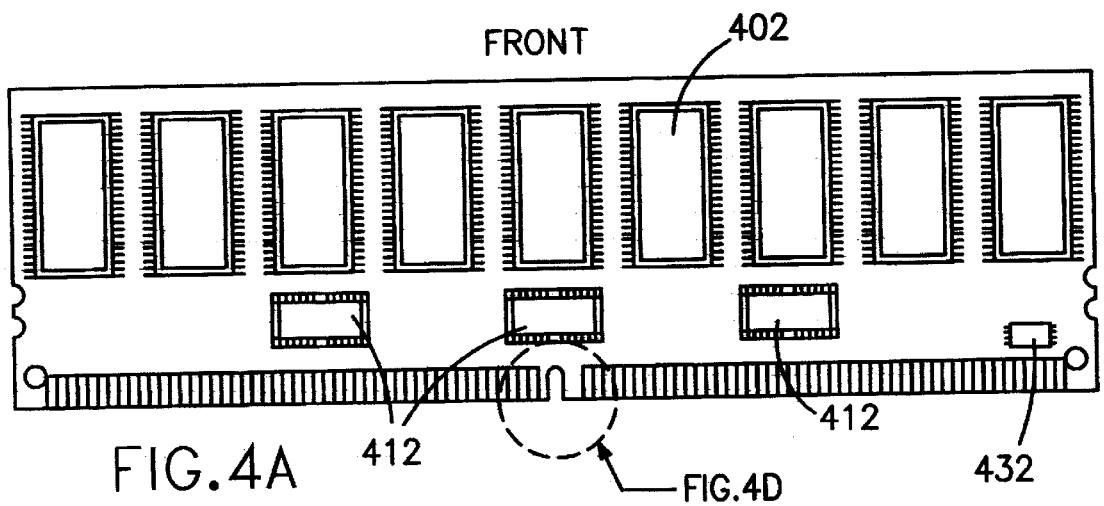
Figure 4B:
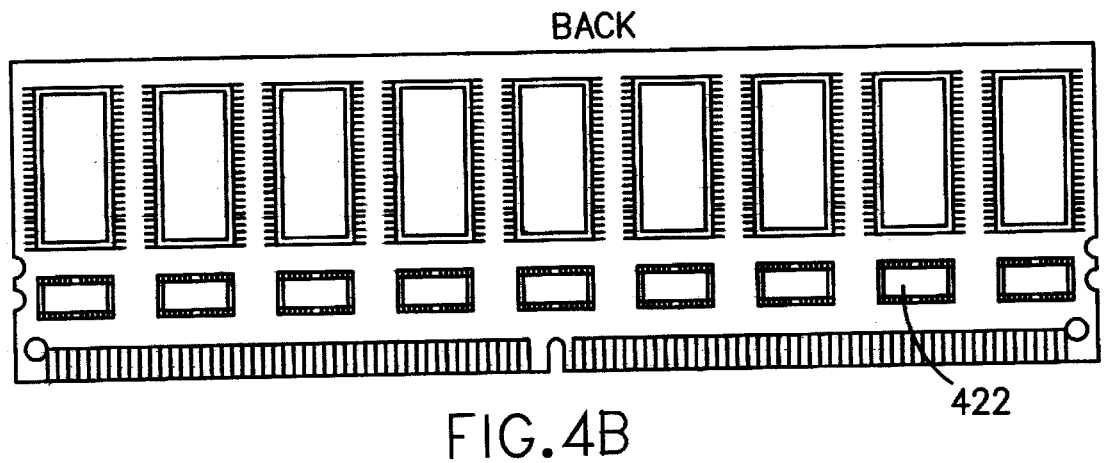
Figure 4C:
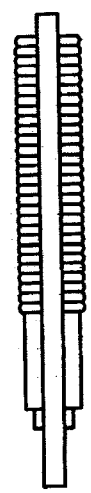
Figure 4D:
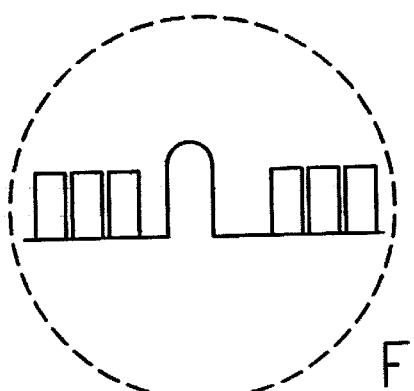

Referring to FIG. 2, which is a functional diagram of a typical 256 Mb SDRAM-DDR memory device with 16 data I/O pins. The labelled signal pins of FIG. 1 are now correlated with and connected to the major parts of the RAM device.

Referring to FIG. 2, the clock 202 is used to time receiving into the address register 212, the address 206 and the bank address 204. The clock is also used to receive the command chip select 201, RAS, CAS, and WE labelled 203, into the timing register 205. The clock delayed by a delay locked loop 208 which is used to drive the data strobe generator 214, and synchronize the output data (for a read) through the output buffer 216 such that the clock and output data are in phase.

The timing register is used to determine if the address bus 210 is directed to the row buffer 218 or the column buffer 220. A bank activate (row selection) occurs, for example, if chip select is low, RAS is low, and CAS is high while a read or write (column selection) occurs, for example, if chip select is low, RAS is low, and CAS is low. (see FIG. 3). If the row is selected then the row address is decoded by the row decoder 222. In this case the 13 address bits create one of 8192 possible rows in the data arrays 232. There are 4 possible arrays, the desired one to activate is determined by bank selector 224. The important point here is that all addresses are valid. If there was an error on a received address, due to, for example, a broken connection in the path between the device creating the address (the memory controller, see FIG. 6) and the memory device, memory would still be sent or received, and the error could be difficult to detect.

Once a row has been selected then the desired column(s) of that row are selected, data in the column buffer is sent to the column decoder 226, which selects the required data bits from the final sense amplifiers 234. Since this is double data rate memory (2 data bits are transferred per DQ port for every clock cycle), 2 data bits must be fetched from the arrays 232 for every clock cycle. Which of these 2 bits is output first is determined by the 2 bit column prefetch unit 236, by inspection of the low order column address CA0 (238).

Similarly CA0 is routed to the data input buffer 242 which receives data on a write from the DQ pins 250, to determine that the two bits received on that clock cycle go to the proper address. The role of CA0 is important in that it is an example of the address information being used in the data portion of the chip. Our invention is to bring all of the address and command information, or as much of it as possible, to the data portion of the chip so that the information received on the address and command lines can be sent out on the data lines, so that a memory controller can check if the address & command it sent to the addressable device was actually received correctly, by inspection of the data lines. This invention will not effect the contents of the RAM or the normal operation of the device, as it will use a separate bus.

Continuing to refer to FIG. 2, on a read of data from the 2-bit column prefetch unit are driven to the output buffers 216 and out the data ports 250. At the same time data strobes UDQS and LDQS are driven, the receiving device can use these strobes in the same manner as the RAM (see below) to register the data. The timing register controls when the data is driven through the I/O control unit 252. The data is driven as a burst, unit 262 determines when the burst is over and signals the output buffer. The number of cycles between the read command and the data (the latency) is programmable as is the length of the burst, the programming is done by a memory controller or other external device by using a special command (mode register write) by proper selection of CKE, CS, RAS, CAS, and WE; the command itself is contained in the address field. Thus address path 210 is directed also to mode register 272, which decodes the instructions during initialization and determines, among other things, the burst length and latency. This invention will make use of the mode register for the special case of memory devices that have them, where there will be created a special command, known as an address wrap function, that directs the address bus to the data bus. Of course, other means can be used to conduct this same address wrap function in other devices without a mode register, all that is required is that device have a means of being programmed as nearly all semiconductor devices do.

Similarly if data is being written to the RAM, data received by the input buffer 242 is directed to the selected row and column of the array 32. The data strobes UDQS and LDQS are used to clock in the data, that is, on rising edge of strobe one datum is registered from the receiver and on the falling edge a second datum is received thereby achieving the double data rate. Again all addresses are valid. If there was an error on a received address, due to example a broken connection in the path between the device creating the address (the memory controller, see FIG. 6) and the memory device, memory would still be written, just to the wrong address. This overwrites otherwise correct data and can have serious consequences in the field of computers.

It is possible to mask, or block, certain data from being written (on earlier memory devices certain data could be masked for both a read and a write). This operation is enabled through use of the mask pins 207. UDM masks DQ8–15 and LDM mask DQ0–7 from being written to the array. The operation is conducted through generation of LDM (282) by the timing register, and presented to the I/O control.

Referring next to FIG. 3, which shows the commands that can be created for the SDRAM-DDR memory devices through use of the commands CKE, CS, RAS, CAS, WE, and DM, and the address. The read and write commands have been discussed above, the other commands are not requires for this invention but are shown for completeness. Referring FIG. 4, the dual in line memory is illustrated. The arrangement of FIG. 4 is of the type shown in an advanced product description of an IBM 128 Megabyte (MB) 184 pin registered 8-byte Dual Inline Memory Module (DIMM) which uses 18, 64 Mb (megabit) SDRAM-DDR devices, 402. The 64 Mb devices are very similar to the previously described 256 Mb devices, but with ¼ the capacity and thus 1 fewer address line will be involved.

The particular DIMM in FIG. 4 has some other structure that is not involved with the functions of the invention. There is an address redrive function 412, whereby the received addresses on the DIMM are received by a clock and redriven to the RAM. It will be apparent that other DIMM not employing this redrive function, would still be applicable to this invention. This DIMM is shown as an example of a collection of addressable devices with a common address bus. There are also data switches 422 shown on the backside of the memory card, useful to isolate the memory devices on this DIMM from other DIMMs when multiple DIMMs share a common data bus. The presence or absence of these data switches is not required by this invention. There is also a small EEPROM 432 which contains descriptive information about the DIMM, the presence or absence of this EEPROM is not essential to this invention.

Figure 5A:
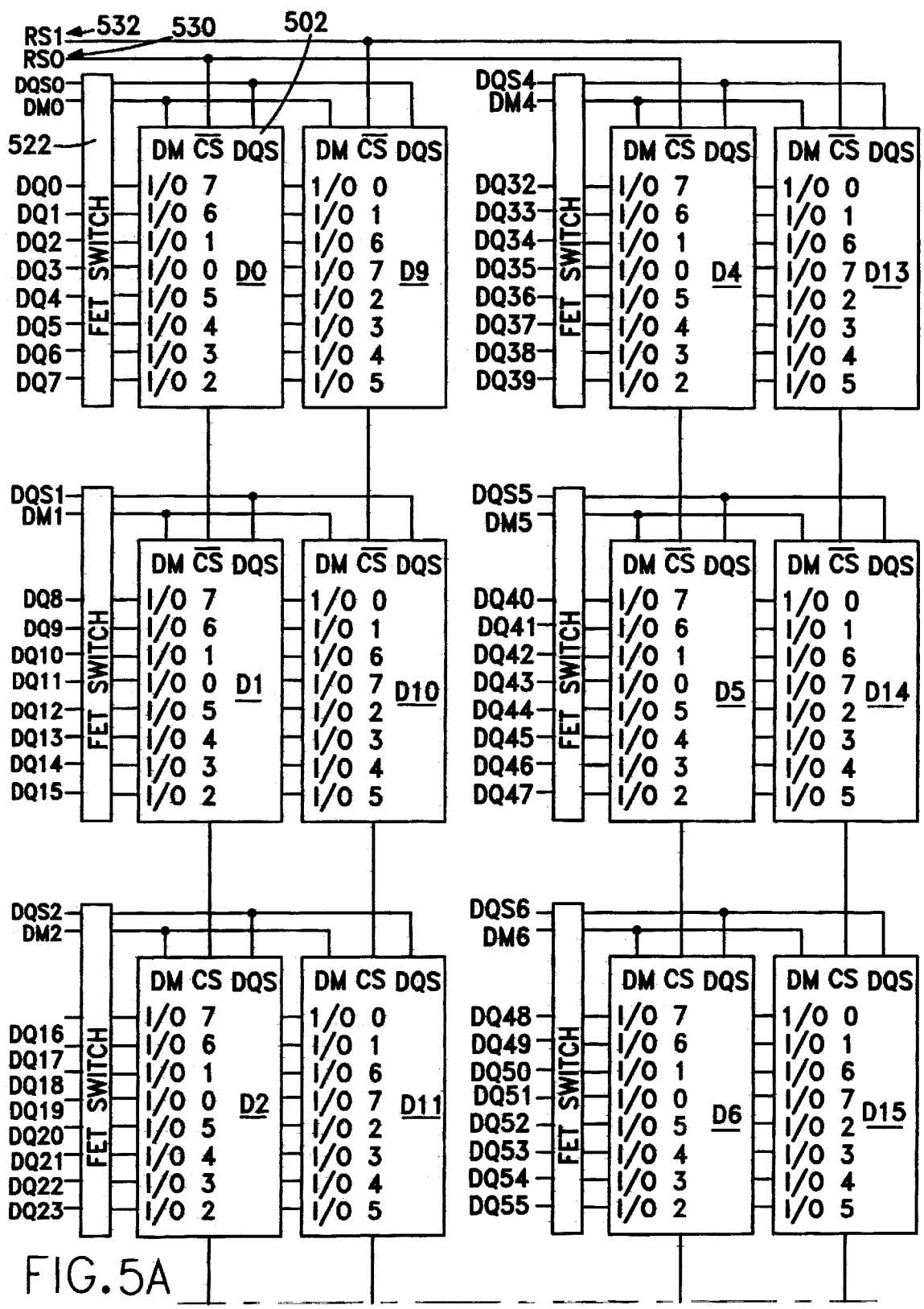

The interwiring is shown in FIG. 5, made up of FIGS. 5A–E. Referring to FIG. 5, the arrangement illustrated is of the type described an advanced product description of an IBM 128 Megabyte (MB) 184 pin registered 8-byte Dual Inline Memory Module (DIMM) wherein there is shown how the 18 64 Mb (megabit) SDRAM-DDR devices 502, the address registers 512, the data switches 522, and the EEPROM 532 are wired together. The address bus to all RAMs is shared. The control bus is also shared, except for a first chip select line 530 which is attached to the 9 RAMs on the front of the DIMM of FIG. 4, and a second chip select line 532 which is attached to the 9 RAMs on the back of the DIMM of FIG. 4. Also the data bus and data strobe between the 9 RAMs in the front of the DIMM of FIG. 4 is shared with the 9 RAMs on the back of the DIMM.

Figure 6:
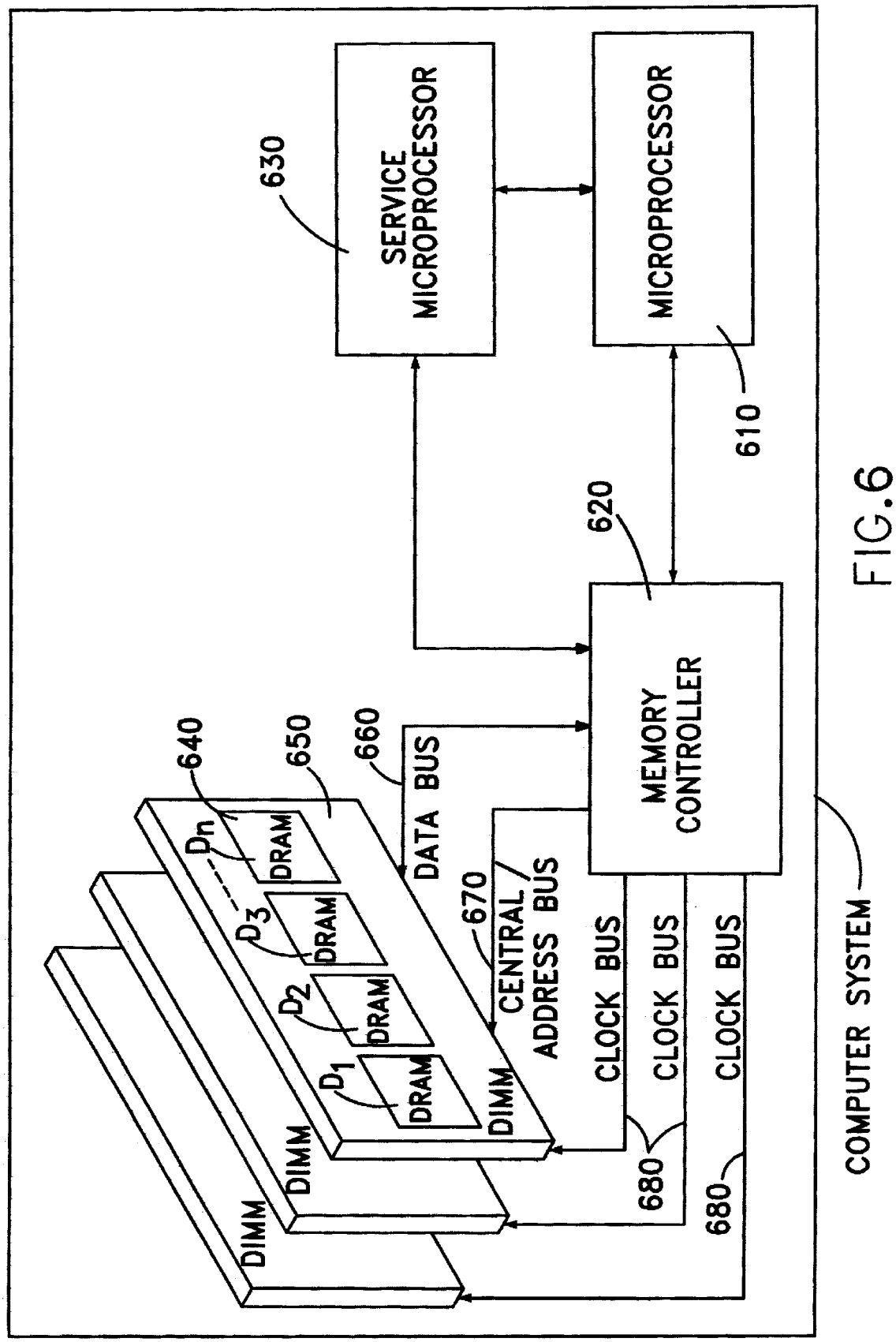

An illustration is provided in FIG. 6 of the overall functional assembly. Referring to FIG. 6 shows a high level schematic of the memory and processor sections of a computer system. There is a processor or processors 610. The processor is connected to a memory controller 620, the processor and memory controller may exist on the same semiconductor device. A service processor 630 is provided for such functions as system initialization, and error processing.. Again the service processor may exist with the processor, or the service processor function can be a part of the processor design. A distinction is made between process and service processors in this description for purposes of explaining entry and exit from the address wrap function. The memory controller controls addressable memory devices 640, which could be SDRAM-DDR memory as in FIGS. 1 and 2, in this case shown on small memory cards 650 as is typical in the industry at this time, an example of which is described in FIGS. 4 and 5.

The memory controller receives (reads) or sends (writes) data to the memory through data bus 660. The controls tells the RAM to read or be written to through command/address bus 670. Separate data busses may go to each DIMM or they can be made common, the invention applies to both. Also separate address/command busses may go to each DIMM or they can be made common, the invention applies to both. It is now common in the industry to have addresses, commands, and data referenced to a clock. The clock can come from a separate chip which synchronizes all components, or, in the case of SDRAM-DDR, or other high speed devices, the practice of sending the clock with the address, command, and data (source synchronous design), is being practiced in the industry. Thus we show the memory controllers sending clocks to the memory through the clock bus 680. How clocking is done is not rigorous with respect to this invention.

The data bus 660 is di-directional. That is, data can be sourced by the controller 620 (WRITE), or the DRAM 640 (READ). For both reads and writes, the sending devices also sources a data strobe 690, which is used to assist in the capture of the data by the receiving device. It should be noted in connection with FIG. 6 that for a write operation, the controller 620 is sending data to all the DRAMs 640. The particular DRAM which is to receive the data is selected by the chip select line, one of the control lines 670.

The timing considerations are illustrated in FIG. 7 where for a write operation the timing is shown in FIG. 7A. Referring to FIG. 7A. Starting at a time tWRES before the falling clock edge 705 preceding rising clock edge 706 which has occurred WL cycles after the write command, the strobe is driven by the controller to a low level. This level transitions to a high level, forming a rising strobe edge 710, a time tPREH after clock edge 705. Subsequently the strobe signal toggles down tDSH later (or ½ a clock cycle), and back up tDSL later, rising or falling once for each datum to be sent from control to RAM. The rising strobe edge 705 is approximately centered in the write data pulse 720, just as the falling strobe edge 730 is approximately centered in the waste data pulse 740. In the RAM, the strobe pulse is received at the time when the signal for the data is at its midpoint, or maximum value, and is thus optimal.

From the point of view of the controller, data is sent timed with some relative time offset, not important here, with respect to the clock while the strobe is sifted ¼ cycle with respect to that clock. A shift of ¼ cycle, or 90 degrees, is somewhat complex to achieve in digital circuits. However, through use of a clock with twice the frequency data can be sent on rising 2x clock pulses while the strobe is set on filling 2x clock pulses. In this manner reliable write data and strobe can be sent from controller to RAM, with the timing of data and strobe optimized to allow for easy capture of data by strobe in the RAM.

The timing of Read data is similar, but this time strobe and data are aligned. Referring again to FIG. 6; for a read operation, data is being sourced by whatever DRAM has been instructed to READ by the controller 620 through the chip select line, one of the control lines 670. The timing for a read is shown in FIG. 7B. Starting at a time tLZ after the rising clock edge 755 which has occurred RL-1 cycles after the read command, the strobe is driven by the controller to a low level. This level transitions to a high level forming a rising strobe edge 760, a time tRPRE after clock edge 755. Subsequently the strobe signal toggles down tDSH later (or ½ a clock cycle), and back up tDSL later, rising or falling once for each datum to be sent from control to RAM. The rising strobe edge 760 is approximately aligned with the start, or transition, of read data pulse 770, just as the falling strobe edge 780 is approximately aligned with the start of read data pulse 780. The data transitions within a time tDQSQ of the strobe transition, and within time tAC of the clock transition. In the controller, the strobe pulse is received approximately coincident with the data, and so must be shifted 90 degrees with respect to the data to be centered in the data pulse.

It is pointed out that in FIG. 6 any of the three DIMMs 650 can be sourcing the read data. If the DIMM nearest the controller is being read, then data sent on data bus 660 travels both towards the controller 620, and away from the controller, or towards the distant DIMM.

The wiring on each DIMM from the data pins on the RAM 640 to the common data bus 660 is called a stub, and is an electrical discontinuity on the data bus. The fact that the RAMs drive into stubs, plus the fact that the controller has to make a difficult 90 degree shift of strobe with respect to data to capture data at its maximum pulse amplitude, makes reading data much more difficult than writing data. Uncertainties in the timing of the 90 degree shift make for less timing margin for read data when compared to write data.

In accordance with the invention the difference in timing margin between read and write operations produced by unbalanced transitions is achieved in an A C manner through the introduction of balancing corrections in the drivers.

In FIG. 8 there is shown an idealized waveform with unbalanced low to high and high to low transitions at the receiver. Referring to FIG. 8 the idealized waveform is of superimposed read strobe labelled element 805 and read data labelled element 806, as would be encountered at the pins of the controller, labelled element 620, in FIG. 6. Also shown is a reference voltage Vref labelled element 850, used by the controller 620 to establish the 0 or the 1 state of the data 806 or strobe 805. The data or strobe is considered to be 0, or low, if it has voltage that is less than Vref at element 850, and is considered to be 1, or high, if it has voltage greater than Vref at element 850. The time at which the data or strobe changes states is called the transition time. Thus the strobe 805 transitions from low to high when the rising edge of the waveform labelled 810 crosses the horizontal line of Vref, element 850. The rate of transition is called the slew rate. In this illustration, the strobe 805 rising slew rate is labelled SL_LH adjacent the element 810 labelling for the strobe waveform 805, similarly, the falling slew rate is labelled SL_HL adjacent the element 820 for the data waveform 806.

Since the strobe function is in essence the capturing of data in the controller, it is common to discuss the set-up time tSU, labeled element 890, depicting the time by which data precedes strobe, and the hold time tHD labelled element 895, depicting the time for which data remains valid, until the next transition. For the SDRAM being described, Vref. is nominally 1.25 V and the slew rate is of order 1 Volt/ns, or less, as measured at the controller 620.

The cross point voltage is determined by comparing the low to high and high to low transitions of data or strobe. The common voltage, or voltage at which the transition edges 810 and 820 cross labelled element (880), is called the cross point voltage, or Vxpt. The difference between Vxpt, element 880, and Vref, element 850, results in a time delay tXPT between the rising and falling transition time. That time delay is expressed in equation 1.

$$tXPT = 2\frac{(Vxpt - Vref)}{SL}.  \qquad \text{Equation 1}$$

The resulting errors can occur at both at the start and at the end of the data pulse. When they occur at the start of the data pulse they reduce tSU and when the occur at the end of the data pulse they reduce tHD.

Where a receiver is to use strobe to capture data, then the data must preceed the strobe by a correction referred to as tSU-min and remain after the strobe for another correction referred to as t-HD-min. As is typical, the strobe is centered in the data pulse window, so that setup and hold times would ordinarily be similar. In the case of read data as shown in FIG. 8, the strobe must be shifted by the controller by ¼ cycle or 90 degrees, in order for the setup and hold times to become similar. The required corrections tSU-min and t-HD-min are properties of the receiver. If the setup or hold time is too small, then data is not reliably captured by the receiver There are many factors that reduce setup and hold time, but one of the largest ones for SDRAM-DDR based memory systems is the error caused by the cross point voltage shift of equation 1.

Cross point voltage shift with respect to the invention is considered caused by a number of factors. One reason can be that the pullup voltage, labelled VIH 830 in FIG. 8, and pulldown voltage, labelled VIL 840 in FIG. 8, as measured at the receiver are not equal. The inequality is primarily caused by unequal driver strength, or impedance, of the pullup and pulldown devices in the driving devices, or RAM in the case of READ data. FIG. 9 shows a simplified DRAM driver.depicting the situation. Referring to FIG. 9, considering the impedance of the pulldown device, labelled element 920, shown as an NFET, is not equal to the impedance of the pullup device, labelled element 910, shown as a PFET and indicated by a diagonal line in the device as in common in complementary CMOS totem pole or push-pull driver circuits, then the DC value of VIH 830 and VIL 840 of FIG. 8 will not be an equal distance from the reference voltage Vref 850 which is intended to be in the midpoint of the nominal driver swing.

There are techniques in the art through the addition of structure for making the pullup and pulldown impedances equal that can be used to make the pullup and pulldown voltages equal.

Reflections from previous data transitions, remaining on the data bus, such as 660 of FIG. 6, can add or subtract from the data pulse being sampled. These reflections can come from a number of sources, including vias in the card wiring, connectors, DRAM package, controller package, the stub wiring on the memory cards 650, etc. Reflections further, can come from the driver on the RAM itself, since as the RAM transitions, its impedance is changing, as for example the pulldown device turns off and the pullup device turns on, in a low to high transition. Still further, the time required for a pullup or a pulldown device to be energized by the predriver can be different. In this case VIH and VIL will be at equal distance from Vref, but the low to high and high to low transitions will not occur at the same time. This causes, for example, line 810 to shift with respect to line 820 in FIG. 8, again causing a cross point voltage shift. This can be due to different delays, or different characteristics, in the pre-drive stages 930 and 940 of the circuit element of FIG. 9.

In FIG. 9, the pullup predrive, labelled element 930, must assert a low to allow pullup device 910 to conduct, which moves driver output 950 up in voltage, ultimately to the driver output voltage rail at input labelled 960 VDDQ. In the same manner pulldown device 920 must receive a low from pulldown predrive 940 to conduct and move driver output 950 to ground, 970. Along the data path 660 of FIG. 6 there can occur various resistive terminations, to reduce reflections, that change the output low voltage from ground to VIL at the receiver, and the output high voltage from VDDQ to VIH at the receiver. These terminations do not affect this invention.

Even if the cross point voltage Vxpt has not shifted from its nominal position of VDDQ/2, there can still exist a degradation in setup or hold time by tXPT caused by a shift in Vref 850 from its nominal value of VDDQ/2 of the driver.

Any of these effects, or any other mechanism which creates an asymmetry in the pullup and pulldown of a driver, or the detection time of a driven signal by a receiver, can cause a reduction in setup time by tXPT, or in hold time by tXPT.

In FIGS. 10A and 10B there is shown a means to correct a reduction in set up or hold time tXPT and calibrate to close to zero. Referring to FIGS. 10A and 10B Shown in FIG. 10A is a small clock regulated delay element labelled 1060, controlled by two signals labelled D0 and D1, and positioned between a pulldown predrive element labelled 1040 and the pulldown device, labelled element 1020, with the output at 1050. Optionally, as shown in FIG. 10B a delay element 1070 can be placed before a predrive pulldown 1040 in a pFET 1010, nFET 1020 series between VDDQ and ground with the output at 1090. The symbol o at a location is an indicator that the signal is inverted.

Further, the delay (1060 or 1070) element could be placed on the pullup circuit also. However, pullup circuits tend to be larger since the transconductance of pFET devices is typically less than nFET devices in CMOS technology, thus the delay is best placed on the smaller, lower capacitance device.

The delay element can be an explicit delay line, or string of inverters, or small capacitances added or subtracted from the predrive pulldown device. It can also be a means to limit the turn-on tine of the pulldown device or the turn-on time of the predrive of the pulldown device by limiting the slew rate directly.

As an example, if the slew rate is 1 V/ns and it is desired to correct a tXPT to an accuracy of 50 ps, there will be needed a minimum delay element of 25 ps. Similarly if it is desired to correct a tXPT of as large as +/−200 ps, a minimum of 8 stages of delay will be needed. Of course, many more stages and finer delay stages are welcome, but 8 stages of 25 ps each should prove sufficient for signaling at 200 to 400 Mb/s/pin, for a memory system similar to that shown in FIG. 6.

In all cases In FIGS. 10A and 10B at elements 1060, and 1070, the amount of delay is set by the two pins, D0 and D1. In FIG. 10C a truth table is provided that shows an arrangement of the 4 states of these two pins. If D0 is 0, no change in delay occurs. If D0 is 1, then a positive delay change is made if D1 is 1, else a negative change is made. The change is arranged, for example, to occur on the rising edge of the clock signal.

Since each RAM on the data bus 620 in FIG. 6 could have a different tXPT, it is required to adjust each RAM on each DIMM 650 of FIG. 6 individually. This can be accomplished by programming the delay elements 1060 using the data line of the RAM. For example, signal D0 of element 1060 can be attached to data line D0 of the RAM, and signal D1 of element 1060 can be attached to data line D1. This special function of data lines D0 and D1 would be enabled with a unique command to mode register set 272 of FIG. 2, which would disable the normal data operation of the RAM and enable the RAM to listen to the data lines D0 and D1 for purposes of minimizing tXPT. This special operation will be called XPT_MODE. All that remains is to show how to set the data lines D0 and D1 to minimize tXPT.

In FIG. 11 there is shown an example receiver with means to control unbalanced transitions. Referring to FIG. 11 the receiver is designed to control the delay elements 1060 and 1070 of FIG. 10. In FIG. 11, data lines D2 and D3 of the RAM to be adjusted are received by receivers 1150 and 1160. These are differential receivers, referenced to Vref. Thus if the input 1110 on the D2 receiver senses a transition low to high with respect to Vref, then the output 1170 as received by latch 1190 will transition from low to high. Note that receiver 1150 is non-inverting, while receiver 1160 is inverting. Thus if the input 1120 on the D3 receiver senses a transition high to low with respect to Vref, then the output 1180 as received by latch 1195 will transition from low to high. Taken together, receivers 1160 and 1170 act as a differential receiver, and drive two high outputs 1105 and 1115 if D2 is high and D3 is low, and drive two low outputs if D2 is low and D3 is high.

In the practice of the invention the minimization of tXPT in a system as is illustrated in FIG. 6, consider that the controller 620 instructs the RAM to send a sequence 10101010 labelled 1130 from data pin D2, that will be referred to as TEST_PATTERN_0 and at the same time a sequence 01010101 labelled 1040, that will be referred to as TEST_PATTERN_1, from data pin D3. TEST_PATTERN_1 is the same pattern as TEST PATTERN_0 but reversed, that is, each 0 is a 1 and each 1 is a 0. The sequences can be different, as long as it is recognized that whenever a transition occurs on D2, an opposite transition occurs on D3, the time difference between the transitions as measured by the controller with respect to Vref (that is, tXPT), can be detected. These data patterns can be made to occur in any number of ways. The simplest way is to have the controller write a burst 1010 on D2 and a burst 0101 on D3 to some address, and then read that address repeatably. The means to cause the test pattern can include arbitrary test patterns. Latch 1190 uses output 1180, from inverting receiver D3 (1160) as a strobe to latch the signal 1170 from non-inverting receiver D2 (1150). Similarly latch 1195 uses output 1170, from non-inverting receiver D2, as a strobe to latch the signal 1180 from inverting receiver D3. There is a setup and hold time requirement on the data with respect to the strobe.

In FIG. 12 there is shown in tabular form related to waveform the timing relationship between inputs and outputs of the receiver of FIG. 11. Referring to FIG. 12 there is illustrated waveforms at the outputs of the D2 latch 1105, and the output of the D3 latch 1115, for different delay settings of the delay box( 1060,1070) in FIGS. 10A & B. which changes the delay of a signal going from high to low, that is, the transition effected by a change in the time to enable the driver pulldown device. As the downward transition of signal D3 is changed from minimum to maximum delay, the data to latch D2L moves from being after the strobe to before the strobe, and thus the output of the latch, 1150, will flip polarity.

FIG. 12 shows the state of the outputs of the latches 1190, 1195 as the high to low transition of the input D3 is scanned with respect to the low to high transition of the input D2. When the rising edge D3_(the inverse of falling edge D3) gets within t_su of the rising edge of D2 the output of latch D3L switches from 1 to 0. This occurs in table A for delay=−1. Similarly when the rising edge of D2 gets within t_su of the rising output of D3_, the output of latch D2L changes from 0 to 1. This occurs in table A at delay=+1. The average of these two times, corresponding in this case to delay=0, is the time at which D2 and D3_each transition at the same time with respect to Vref. That is, tXPT has been made equal to zero to within setting errors. The circuit described in FIG. 11 must find the delay setting of the driver which corresponds to tXPT being zero in the receiver. While, the falling edge of D2 is also changed by the scan, but in view of the fact that the latches D2L and D3L trigger on the rising edge only, the falling edge is not involved.

The scan of the falling edges of D2 and D3 are caused. by setting the delay for the pulldown devices of all I/O on the RAM to be adjusted to be at the minimum value, and then incrementing. An assumption is made that all the I/O on the RAM are in error in the same way. This is a valid assumption as the things which change driver response are changes to temperature, voltage, and process conditions; all of which are common to all I/O on the RAM. Similarly the things which change the receiver are also temperature, voltage, and process, as well as Vref and which are also common to all I/O.

Since we are not observing two states of a single I/O but rather two different I/O, timing differences between these I/O (skew) will also cause an apparent cross point voltage shift. Skew can be caused for example by having two different wire lengths between driver-receiver pairs D2 and D3. Skew will also result from receiver D2 in FIG. 11 being non-inverting, while receiver D3 in FIG. 11 is inverting. The result of a skew between D2 and D3 will cause an error in the delay setting for minimizing the absolute value of tXPT. This is shown by the table B, and the waveforms and delay settings within.

The effects of skew between D2 and D3 can be removed by reversing the waveforms, and giving for example 010101 to the D2 input of FIG. 11 (1110) and 101010 to the D3 input of FIG. 11 (1120), and averaging the resultant delay for tXPT to be zero for these inputs to those found in the first scan. That this is true is seen in Table C, where reversing the inputs now causes an equal and opposite shift in the apparent position of the delay setting as found in table B. The correct value, i.e. delay=0 from table A, is the average of the delays in tables B and C. The average and direction of movement are indicated in the tables.

The full calibration would involve the following.

An assumption is made that the RAM drivers have been adjusted to have equal impedance, within errors, for pullup and pulldown devices.

1) Write Test_Pattern_0 to the RAM at some address.
2) Place RAM in cross point voltage adjustment mode (XPT_MODE) by writing to mode register in RAM and set delay increment in RAM to minimum delay.
3) Place RAM back in standard operating mode and read TEST_PATTERN_0 repeatably.
4) Sense result in controller.
5) Place RAM in XPT_MODE and increment delay on the high to low transitions of D2 and D3 by setting RAM inputs D0 and D1 to 1.
6) Repeat steps 3 to 5 until delay is at maximum.
7) Compute the value of delay that makes the absolute value of tXPT as small as possible. This is DELAY_SETTING_0.
8) Repeat steps 1 to 6 for Test_Pattern_1 which is the inverse of TEST_PATTERN_0 and Compute the value of delay that makes the absolute value of tXPT as small as possible. This is DELAY_SETTING_1.
9) Compute the average of DELAY_SETTING_0 and DELAY_SETTING_1 and write this delay to the RAM while in XPT_MODE. The RAM is now calibrated.
10) Exit XPT_MODE. At this point the RAM has been calibrated to have tXPT as small as possible.

What has been described is an apparatus and method in the use of strobe and data waveforms to equilibrate the time of 1—>h and h—>1 transitions at the receiver; and improving the performance of the devices involved.

What is claimed is:

1. Apparatus for establishing a minimum time delay in data communication between rising and falling transitions measured from an intersection that is the crosspoint of a rising strobe voltage signal and a declining data voltage signal, comprising
   a switching element operable to control unbalanced transitions in strobe and data signal lines wherein,
   a data voltage signal is receivable at a first input to a first series path through a receiver element and latch element,
   a strobe voltage signal is receivable at a second input to a second series path through an inverting receiver element and latch element,
   said receiver element and said inverting receiver element both being referenced to Vref in said apparatus,
   the output of said receiver element being cross connected to the control input of said latch element in said second series path,
   the output of said inverting receiver element being cross connected to the control input of said latch element in said first series path,
   means applying a test pattern of alternating 1 and 0 so that for every transition at said first input, an opposite transition occurs at said second input, and,
   means for iterating said test patterns for minimum delay value as sensed between the outputs at said latch elements.

2. The method of minimizing a time delay in data communication apparatus between rising and falling transitions measured from an intersection that is the crosspoint of a rising strobe voltage signal and a declining data voltage signal, comprising the steps of:
   providing a switching element connected between a strobe voltage signal line and a data voltage signal line wherein,
   said data voltage signal is receivable at a first input to a first series path through a receiver element and latch element,
   said strobe voltage signal is receivable at a second input to a second series path through an inverting receiver element and latch element,
   said receiver element and said inverting receiver element both being referenced to Vref in said apparatus,
   the output of said receiver element being cross connected to the control input of said latch element in said second series path,
   the output of said inverting receiver element being cross connected to the control input of said latch element in said first series path,
   applying a test pattern of alternating 1 and 0 to both said first and second inputs so that for every transition at said first input, an opposite transition occurs at said second input, and,
   iterating application of said test patterns to establish a minimum value for delay as sensed between the outputs at said latch elements.

3. In data processing apparatus of the type wherein data is communicated between a driver device comprising series connected pFET and nFET devices each having a gate electrode and a receiver device in said apparatus with communication of said data taking place as a transition measured from an intersection that is the crosspoint of a rising strobe voltage signal and a declining data voltage signal, the improvement comprising:
   the introduction of a specific compensation signal for a time delay in the time of said transition between said rising strobe voltage signal and said declining data voltage signal and wherein said specific time delay compensation data voltage signal is applied at said gate electrode of said nFET device.

4. The improvement of claim 3 wherein said receiver is arranged to control unbalanced transitions in first and second data lines wherein
   said data signal in said first data line is received in a first series path through a receiver element and latch element,
   said data signal in said second data line is received in a second series path through an inverting receiver element and latch element,
   said receiver element and said inverting receiver element both being referenced to Vref,
   the output of said receiver element being cross connected to the control input of said latch element in said second data line, and,
   the output of said inverting receiver element being cross connected to the control input of said latch element in said first data line.

5. A timing improvement in data processing apparatus of the type wherein there is a series connected pFET and nFET each having a gate electrode, strobe voltage signal driver circuit element, and a data voltage signal receiver, and where a datum increment is established using a transition measured from an intersection that is the crosspoint of a rising strobe voltage signal and a declining data voltage signal, comprising providing for a specific time delay signal in the transition time for said rising strobe voltage signal and that said specific time delay signal is applied at said gate electrode of said nFET.

6. The improvement of claim 5 including a switching element connected to control unbalanced transitions that may occur in strobe and data lines, the connections of said switching element including:

said strobe voltage signal is introduced into a first path including a series connected receiver element and latch element, said data voltage signal is introduced into a second path including a series connected inverting receiver element and latch element, said receiver element and said inverting receiver element both being referenced to the Vref of said apparatus, the output of said receiver element being cross connected to the control input of said latch element in said second path, and, the output of said inverting receiver element being cross connected to the control input of said latch element in said first path.

* * * * *